United States Patent [19]

Liscio et al.

[11] Patent Number: 5,323,014
[45] Date of Patent: Jun. 21, 1994

[54] OPTOCOUPLER BUILT-IN SELF TEST FOR APPLICATIONS REQUIRING ISOLATION

[75] Inventors: Edward P. Liscio; Richard A. Riggio, both of Pittsburgh, Pa.

[73] Assignee: AEG Transportation Systems, Inc., Pittsburgh, Pa.

[21] Appl. No.: 24,398

[22] Filed: Mar. 1, 1993

[51] Int. Cl.$^5$ .............................................. G02B 27/00
[52] U.S. Cl. .................................. 250/551; 307/311
[58] Field of Search .................. 250/551, 214 R, 216; 307/311

[56] References Cited

U.S. PATENT DOCUMENTS

| | | | |
|---|---|---|---|
| 4,328,516 | 5/1982 | Colpack et al. | 358/113 |
| 4,604,613 | 8/1986 | Clark | 340/638 |
| 4,652,764 | 3/1987 | Nagano | 250/551 |
| 4,771,403 | 9/1988 | Maskovyak et al. | 364/900 |
| 4,808,975 | 2/1989 | Hochhaus et al. | 250/551 X |
| 4,914,420 | 4/1990 | Khan | 340/316 |
| 4,990,896 | 2/1991 | Gray | 250/551 X |
| 5,089,696 | 2/1992 | Turpin | 250/227 |

FOREIGN PATENT DOCUMENTS 3136567 9/1981 Fed. Rep. of Germany.
3436844 10/1984 Fed. Rep. of Germany.
1233630 9/1984 U.S.S.R..

Primary Examiner—David C. Nelms
Assistant Examiner—John R. Lee
Attorney, Agent, or Firm—Spencer, Frank & Schneider

[57] ABSTRACT

An optocoupler circuit arrangement includes an isolated power source for producing a bipolar test signal, an analog multiplexer switching matrix coupled to the isolated power source for receiving and distributing the test signal, control logic for controlling the analog multiplexer switching matrix, and a plurality of optocouplers, each having a respective electrically isolated output circuit and an input circuit for receiving input signals from an external source. The optocoupler input circuits are coupled to the analog multiplexer switching matrix to receive respective test signals therefrom under control of the control logic. Blocking circuitry is provided at the optocoupler input for isolating the test signals from the external source.

15 Claims, 7 Drawing Sheets

OPTOCOUPLER BUILT-IN SELF TEST FOR APPLICATIONS REQUIRING ISOLATION

BACKGROUND OF THE INVENTION

1. Field of the Invention

The invention relates to the fields of optocoupler electrical isolation and self-testing, and in particular, to a method and arrangement for optocoupler self-testing.

2. Background Information

In many applications, such as in medical or process control equipment, electrical isolation is required for all I/O (Input/Output) signals to and from associated processing equipment. Commonly optocoupler devices are used to achieve the desired electrical isolation levels in these applications.

An optocoupler typically consists of a gallium arsenide infrared emitting diode optically coupled with a silicon phototransistor in a dual in-line package. Such devices may typically have a value on the order of 2500 volts per minute of isolation between input and output pins.

An issue that often arises with optocoupler circuitry is testability. Conventionally, these devices cannot be functionally tested on-line without violating the electrical isolation barrier, a significant drawback adversely affecting circuit reliability and/or compromising isolation requirements.

SUMMARY OF THE INVENTION

The above-described drawbacks and limitations existent in the field are overcome by providing an optocoupler self-testing method and circuit arrangement according to the present invention. In particular, the present invention provides built-in self test (BIST) signal injection for optocoupler circuitry, while still maintaining the required electrical isolation barrier.

According to one aspect of the invention, an optocoupler circuit arrangement includes an isolated power source for producing a bipolar test signal, an analog multiplexer switching matrix coupled to the isolated power source for receiving and distributing the test signal, control means for controlling the analog multiplexer switching matrix, and a plurality of optocouplers, each having a respective electrically isolated output circuit and an input circuit for receiving input signals from an external source. The optocoupler input circuits are coupled to the analog multiplexer switching matrix to receive respective test signals therefrom under control of the control means. Blocking circuitry is provided at the optocoupler input for isolating the test signals from the external source.

According to another aspect of the invention, the isolated power source is a DC-DC converter for producing the bipolar test signals. A plurality of analog multiplexer pairs are used as the switching matrix to distribute the test signals to the optocoupler input circuits.

According to another aspect of the invention, the analog multiplexers receive control signals from the control means for controlling the operation of the multiplexers. The analog multiplexer switching matrix is electrically isolated from the control means by isolating means.

According to another aspect of the invention, the optocoupler input circuit blocking means include respective protection diodes in series with respective optocouplers. The diode prevents test signal current flow back into the source of the input signal.

According to another aspect of the invention, the diode has a resistor in series therewith, for limiting the current flowing through the input of the optocoupler. The resistor value is sized according to the expected input voltage level.

These and other objects and aspects of the invention are better understood with reference to the detailed description and accompanying drawings, and it will be understood that changes in the specific structure shown and described may be made within the scope of the claims without departing from the spirit of the invention.

DETAILED DESCRIPTION OF THE PREFERRED EMBODIMENTS

The invention will now be described in more detail by example with reference to the embodiments shown in the Figures. It should be kept in mind that the following described embodiments are only presented by way of example and should not be construed as limiting the inventive concept to any particular physical configuration.

Figure 1:
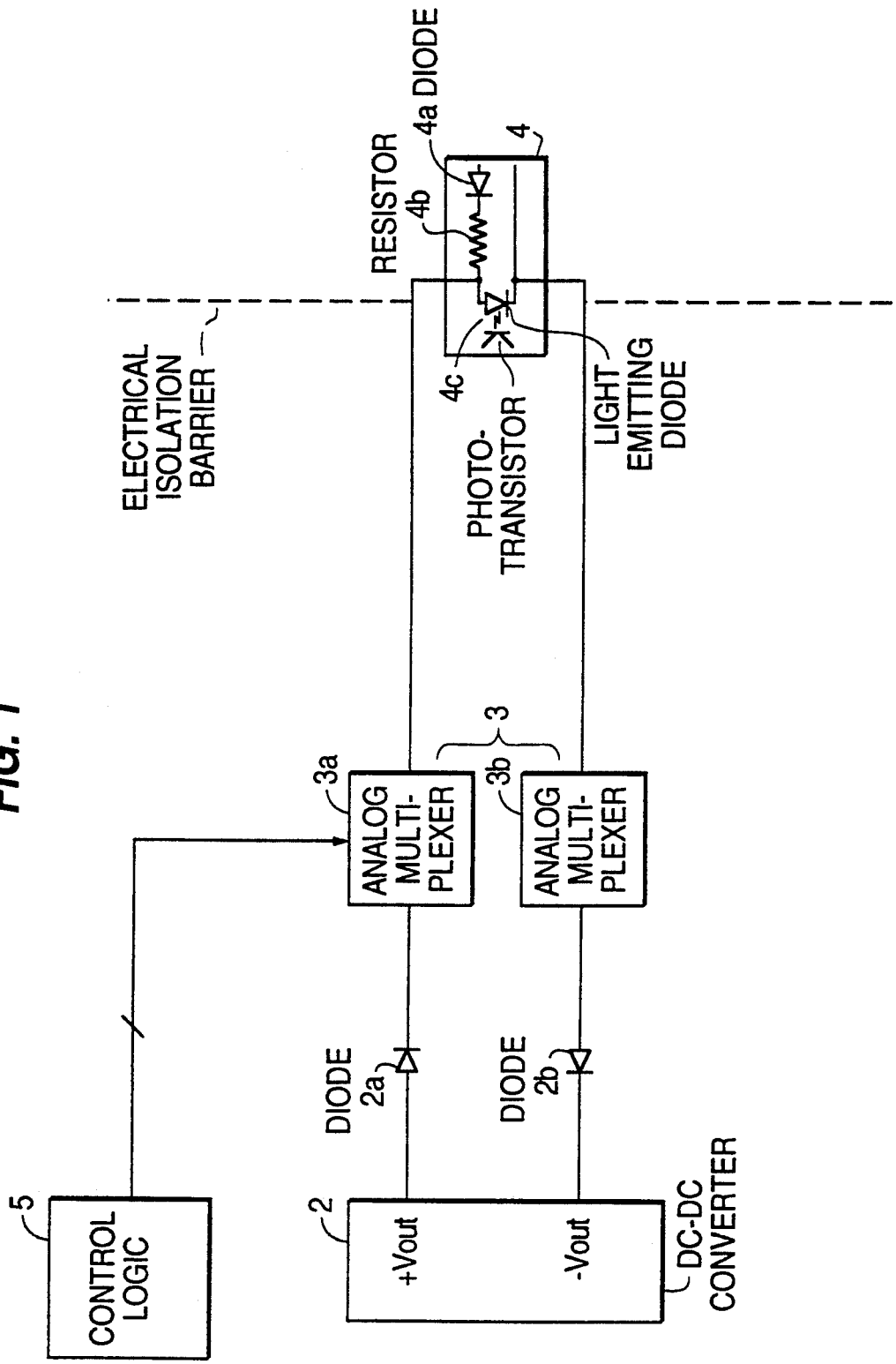
FIG. 1 shows a block diagram of an embodiment of the optocoupler built-in self-test (BIST) circuitry.

Optocoupler BIST Operation: FIG. 1 shows a block diagram of an embodiment of the basic optocoupler BIST circuitry. The functional blocks include an isolated power source 2, 2a, 2b for providing a test injection signal, an analog multiplexer switching matrix 3 having, for example, two analog multiplexers 3a and 3b, and a typical optocoupler input circuit 4 with diode 4a and resistor 4b provided.

The isolated power source in the illustrated embodiment is an isolated DC-DC converter 2 with isolation diodes 2a and 2b, for producing the test injection signals. The DC-DC converter outputs +Vout and −Vout signals, and typically has a 60 second/60 Hertz test voltage isolation value of 8000 VAC peak and a continuous DC isolation value of 5000 VDC from input to output. A DC-DC converter device suitable for medical isolation applications would be, for example, a Burr-Brown PWR1726, which is a 1.5W rated output power, unregulated DC-to-DC converter.

The analog multiplexer switching matrix 3 includes a series of analog multiplexers. In the embodiment illustrated in FIG. 1, two analog multiplexers 3a, 3b are shown. The analog multiplexers 3a, 3b are used for distributing the respective positive and negative test signals +Vout and −Vout to the optocoupler input circuit 4. These multiplexers 3a and 3b receive control signals from control logic 5 which selects the input to output signal connections, as well as controlling the overall operation of multiplexers 3a and 3b themselves. These control signals to the switching matrix 3 are also electrically isolated from the optocoupler input section 4, as will be explained later.

The illustrated optical isolation circuit 4 is provided with a protection diode 4a and a series resistor 4b, in series with the input to optocoupler 4c to prevent current flow back into a source of an input signal (not shown). The illustrated typical optocoupler 4c includes a light emitting diode (LED) for receiving the input signal through the protection diode 4a and resistor 4b, and a photo-transistor for receiving light signals from the light emitting diode and producing an output signal, as indicated. The series resistor 4b limits the current flowing through the input circuit 4 of the optocoupler 4c. The value of the resistor 4b is selected according to the expected input voltage level, as would be readily apparent to one of ordinary skill in the art. Together with diode 4a, resistor 4b virtually prevents an injected test signal from flowing into the source of the input signal.

The positive and negative test signals from multiplexers 3a and 3b, respectively, are injected directly across the light emitting diode input as shown. Protection diode 4a and protection resistor 4b are connected so that the test signals from the multiplexers 3a and 3b do not pass to the source of the input signal, but they do not affect the level of the test signals provided to the light emitting diode.

Figure 2:
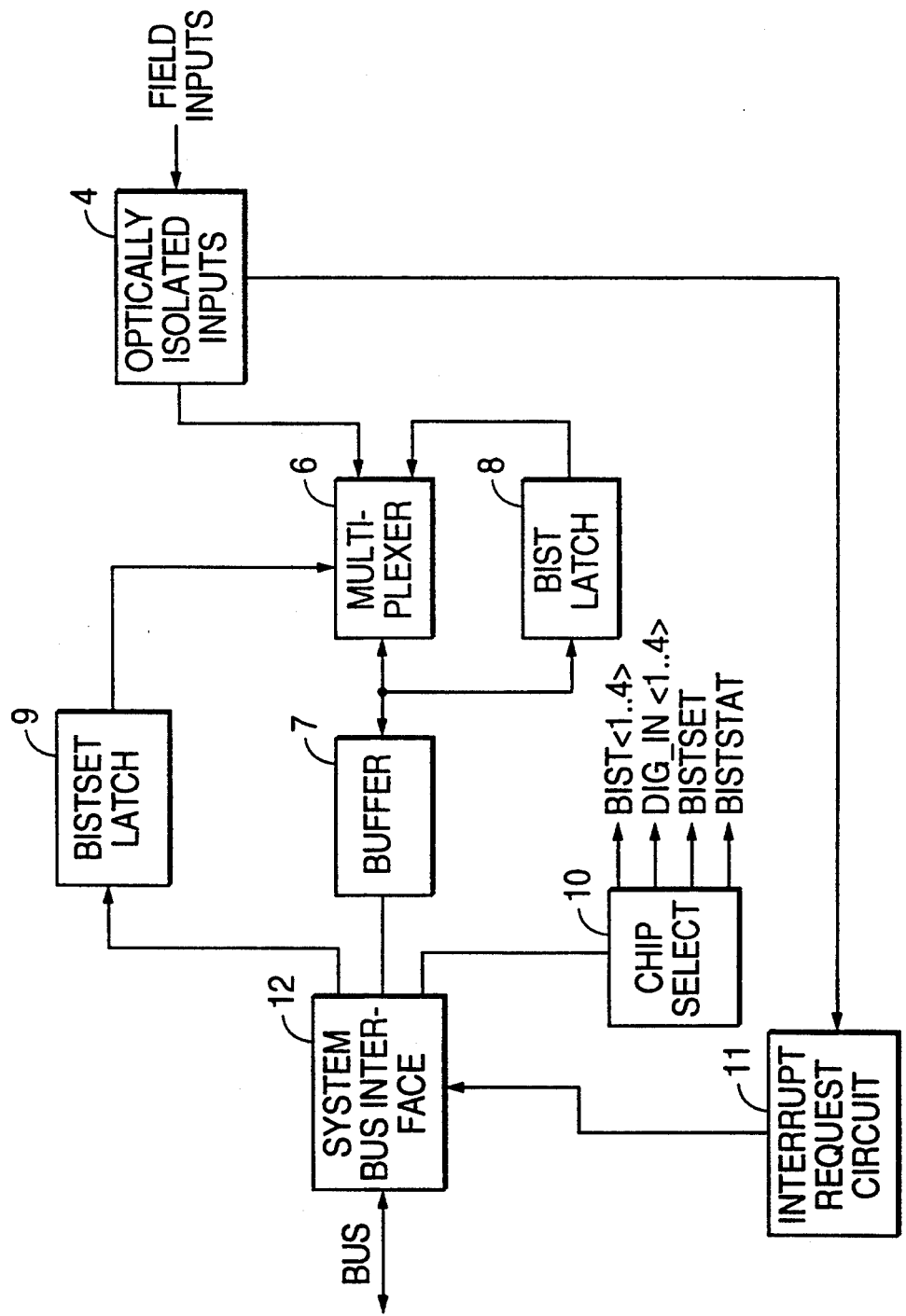
FIG. 2 illustrates an embodiment of an isolated digital input section with built-in self-test circuitry.

FIG. 2 shows in block diagram form, and FIGS. 2a to 2e show in more detail, an implementation of an application of optocouplers with built-in self-test circuitry to a digital input section of, e.g., a process control system. The embodiment shown is for 32 inputs, however adaptation to other numbers of inputs would be routine.

With reference to FIG. 2, a process being monitored provides input signals (Field inputs) to the optically isolated inputs 4. The system optionally may use the interrupt request circuit 11 to indicate data is ready to be read. A polling scheme or a combination of interrupt and polling may be used as well. The optically isolated field inputs and inputs from BIST latch 8 are provided to multiplexer 6 and selected by BISTSET latch 9. The output from the multiplexer 6 is provided to a buffer 7 and system bus interface 12. During normal data gathering, a system bus master performs a read operation to read the current state of the inputs 4. However, with the circuitry disclosed it is possible to select whether input to the system bus is from the external field inputs 4 or from the BIST latch 8 with the BISTSET latch 9. A self-test is then performed as follows:

(1) select the source to be the BIST latch 8 by writing to the BISTSET latch 9;

(2) write to the BIST latch 8;

(3) read the BIST latch 8;

(4) determine the integrity of the read-back data by comparing it to the written data;

(5) repeat steps 1 to 4 for the remaining inputs;

(6) return to normal operation by writing again to the BISTSET latch 9.

Once the integrity of the read-back data is established, the optocouplers themselves can be tested, as will now be described in conjunction with FIGS. 2a to 2e.

Figure 2A:
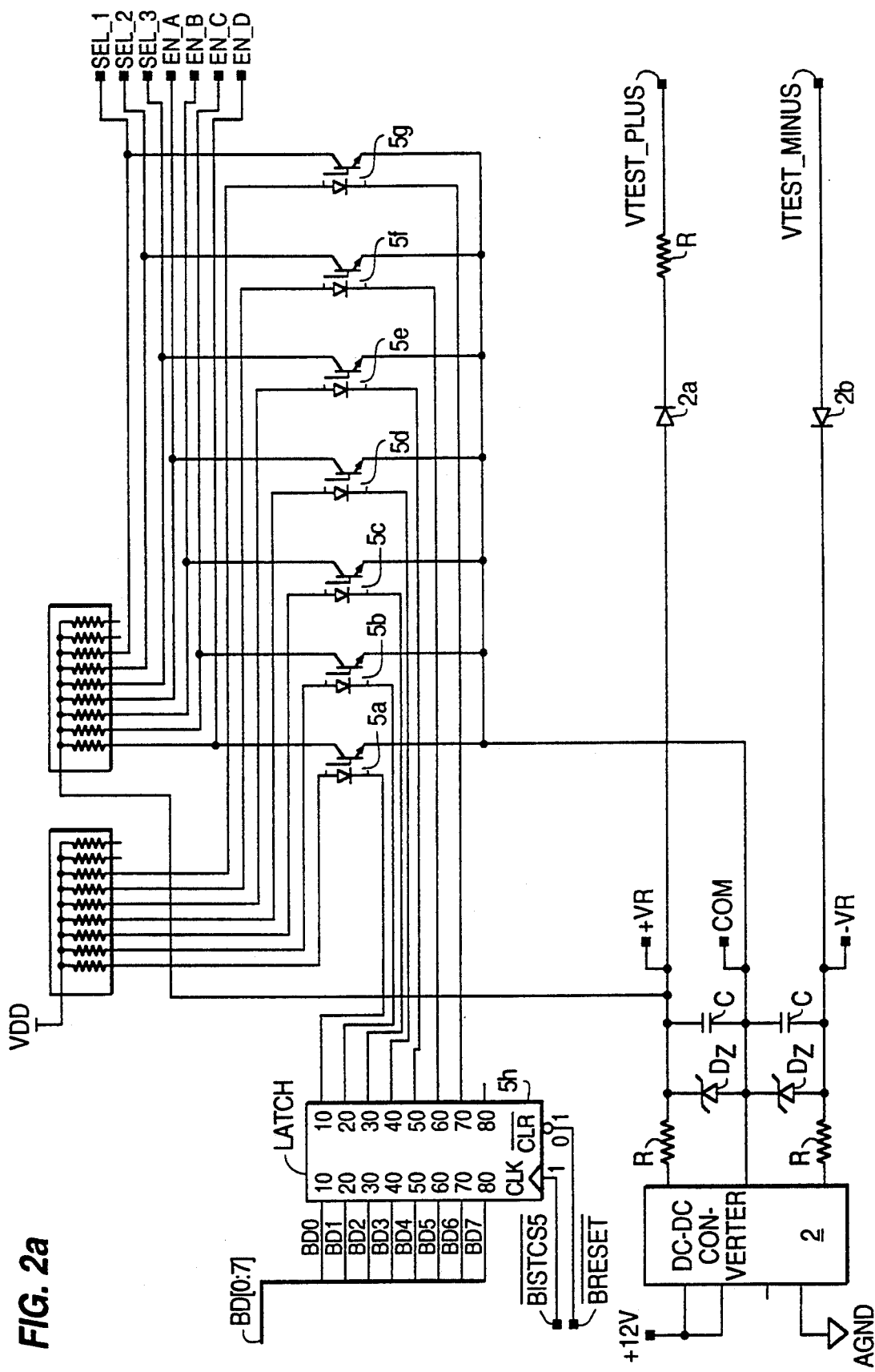
FIGS. 2a to 2e illustrate details of components shown in FIG. 2.

FIG. 2a shows test voltage generation circuitry including DC-DC converter 2 which produces positive, negative and common voltages. The voltages from the DC-DC converter 2 are filtered and regulated by the resistor-Zener diode-capacitor arrangement (R—D$_z$—C) illustrated. Values for the positive line and negative line resistors R are 73.2Ω and 147Ω, respectively in the preferred embodiment. The capacitors are 0.1 μF and the Zener diodes are 1N5349's, in the preferred embodiment. The positive and negative voltages output from the filter/regulator arrangement R—D$_z$—C are passed through isolation diodes 2a and 2b, which are for example, 1N4935's in the preferred embodiment, and supplied as VTEST_PLUS and VTEST_MINUS voltages to the multiplexer switching matrix which is shown in FIGS. 2c and 2d and described later. The positive test voltage line which produces VTEST_PLUS also includes a current limiting resistor R as shown, e.g., a 3.32KΩ resistor in the preferred embodiment.

Also illustrated in FIG. 2a is the isolated multiplexer control logic 5 of FIG. 1. Seven optocouplers 5a–5g produce the three isolated select signals SEL_1 to SEL_3 and the four isolated enable signals EN_A to EN_D from data received by latch 5h on data bus B D[0:7]. Latch 5h is clocked by the BISTCS5 signal and is cleared by the BRESET signal through the system bus interface. In the preferred embodiment being described, the three isolated select and four isolated enable signals control four pairs of multiplexers to provide a total of 32 positive and negative test signals, as illustrated in FIGS. 2c and 2d and described in more detail later. The latch 5h is a 54ACT273 and the optocouplers are 4N35's, for example. The photo-transistors of these optocouplers 5a–5g are coupled to the filtered regulated voltage from the, e.g., Burr-Brown PWR1726, DC-DC converter 2 by first resistors (10KΩ) and the LED's to VDD through second resistors (2.2KΩ), as shown.

Figure 2B:
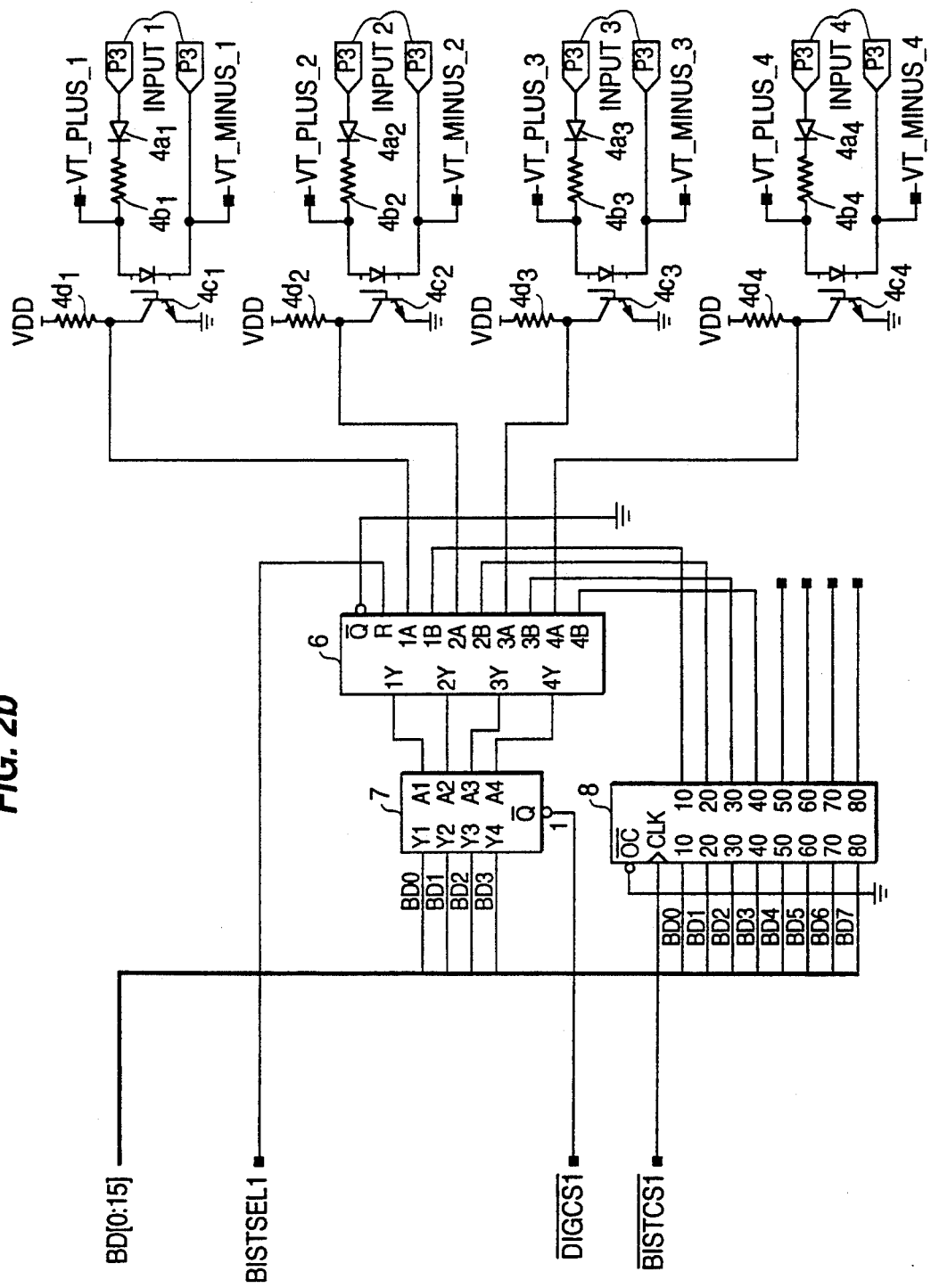
Figure 2C:
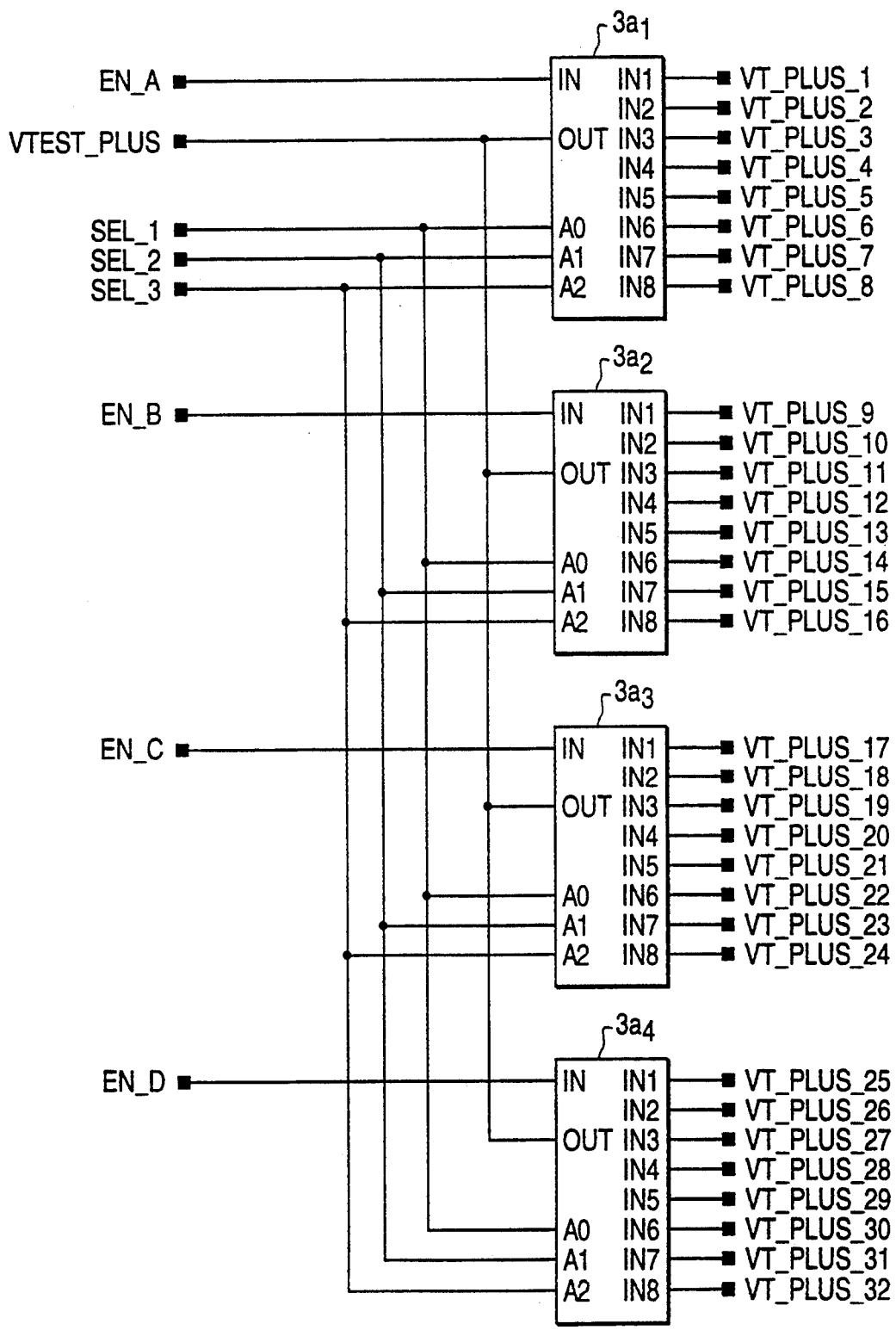
Figure 2D:
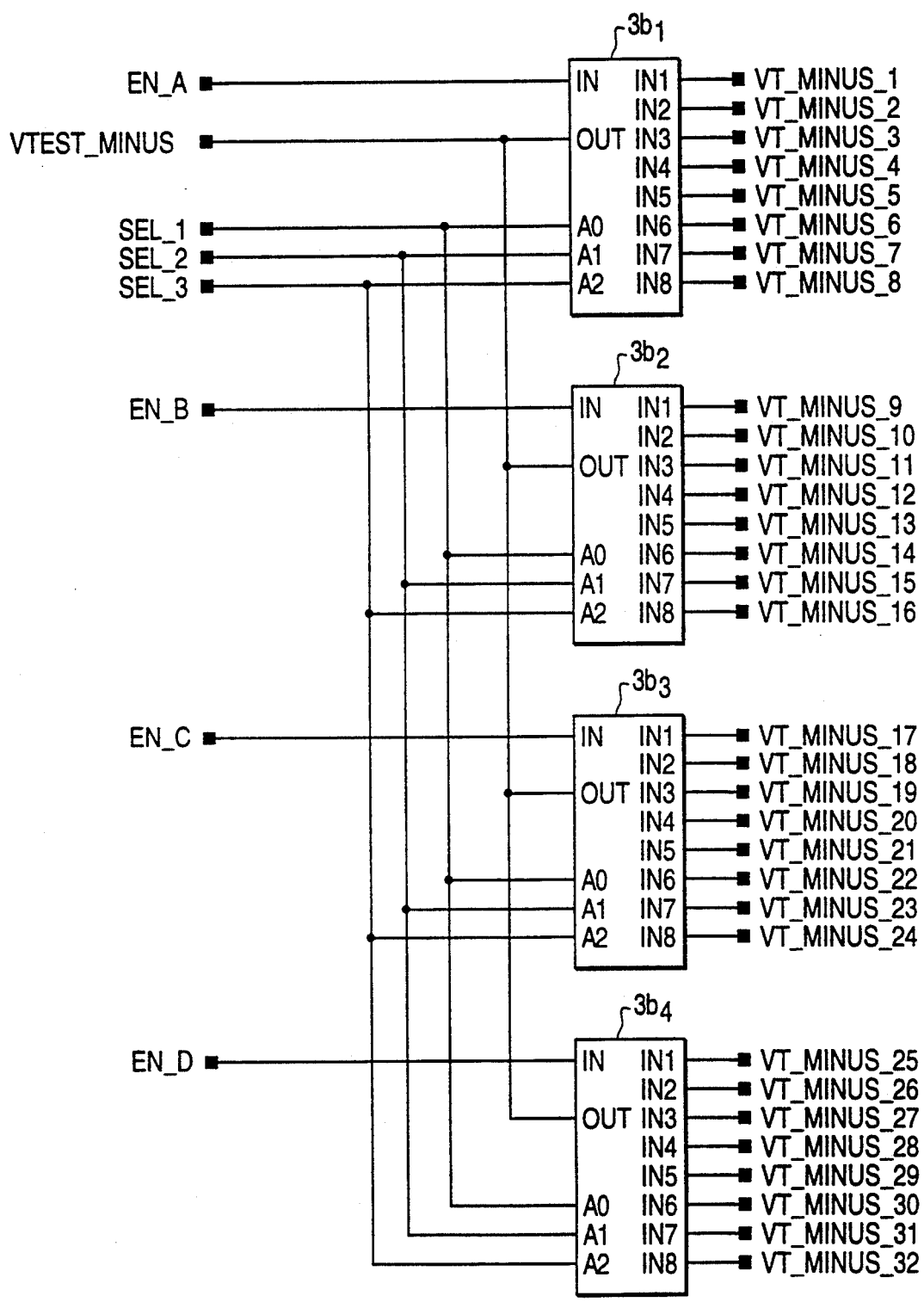

FIG. 2b shows the arrangement of four of the isolated digital input circuits out of the 32 provided in this embodiment. Process sensor or instrument input signals, for example, are received at the illustrated inputs labelled INPUT 1–INPUT 4. The inputs each have a respective protection diode $4a_1$–$4a_4$ and a respective protection resistor $4b_1$–$4b_4$ in series with the light emitting diode (LED) of the respective optocoupler $4c_1$–$4c_4$. The protection diodes are, for example 1N4935's in series with 3.32KΩ protection resistors. The optocouplers are 4N35's, for example, connected to VDD through 4.7KΩ pull-up resistors.

Positive test signals VT_PLUS_1 to VT_PLUS 4, and respective negative test signals VT_MINUS_1-VT_MINUS_4 are injected to respective ones of the input circuits as shown. These test signals are derived from the DC-DC converter 2 (FIG. 2a) and distributed by a plurality of pairs of multiplexers 3a and 3b, as will now be described in more detail with reference to FIGS. 2c and 2d.

FIGS. 2c and 2d each show four multiplexers $3a_1$–$3a_4$ and $3b_1$–$3b_4$, respectively. The arrangement of multiplexers in FIG. 2d is the same as in FIG. 2c except that the multiplexers in 2c receive the positive test voltage signal VTEST_PLUS from the DC-DC converter arrangement of FIG. 2a and the multiplexers in FIG. 2d receive the negative test voltage VTEST_MINUS. Therefore, in the interests of economy, only FIG. 2c will be described in detail.

The multiplexers $3a_1$–$3a_4$ each receive as input the VTEST_PLUS signal and the three isolated select signals SEL_1 to SEL_3 from the circuitry shown in FIG. 2a. The three isolated select signals allow for eight possible outputs from each multiplexer. If enabled by isolated enable signal EN_A, the first multiplexer may output to an associated optocoupler input circuit one of the eight identical test voltages VT_PLUS_1-VT_PLUS_8 depending on the state of the select signals The four enable signals EN_A-EN_D determine which ones of the four multiplexers will be enabled to provide test signal output.

Since the corresponding multiplexers $3b_1$–$3b_4$ in FIG. 2d receive the same select and enable signals, they are controlled in the same manner as those in FIG. 2c simultaneously. Therefore, the selected output from the enabled multiplexer, i.e., the test voltages VT_PLUS_1-VT_PLUS_32, is provided to the respective isolated input circuit (FIG. 2b) along with the respective test voltage VT_MINUS_1-VT_MINUS_32. The protection resistors $4b$ and diodes $4a$ prevent the test voltages from causing a current to flow into the input sensors or instruments connected to the isolated inputs as has been mentioned previously. On-line testing can, therefore, be advantageously performed.

Referring again to FIG. 2b, the outputs of the optocouplers $4c_1$–$4c_4$ at the photo-transistors are pulled-up to, e.g., +5V (VDD) by the 4.7KΩ current-limiting resistors $4d_1$–$4d_4$. Therefore, if an input voltage level is higher than the minimum turn-on voltage for the optocoupler circuit, the output will be at logic-level "0". Conversely, if the input voltage is at zero voltage potential, the output of the optocoupler will be at +5V or logic-level "1". The test voltages injected are at a level where they effectively "drown out" any input signal present during testing procedures.

The outputs from the optocouplers $4c_1$–$4c_4$ are provided to the "A" inputs of a multiplexer 6, e.g., a 54ACT257, which also receives input from an eight-input BIST latch 8, e.g., a 54ACT374, at multiplexer "B" inputs. The output (1Y-4Y) from the multiplexer 6 is provided to a four-input buffer 7, e.g., a 54ACT244, which provides its output to the data bus BD[0:4] forming a portion of the system bus interface 12 (see FIG. 2). The eight-input BIST latch 8 receives its input from the bus BD[0:7] and provides four of its outputs to the multiplexer 6 "B" inputs under control of the BISTCS1 and BISTSEL1 signals. The other four outputs of the eight-input BIST latch 8 are provided to an identical multiplexer (not shown) associated with a second four isolated inputs (not shown) of the 32 in this embodiment.

The illustrated connection of multiplexer 6, buffer 7 and BIST latch 8 between the system bus and the inputs 4 provides for read-back self-testing, as described earlier. The BISTSEL1 signal determines whether the data from the BIST latch 8 or from the isolated inputs 4 is passed by multiplexer 6 to buffer 7. The DIGCS1 signal selects the buffer 7 to latch the data to be read on the data bus BD[0:3]. The BISTCS1 signal to BIST latch 8 clocks the data from the data bus BD[0:7] to the BIST latch 8 outputs.

Figure 2E:
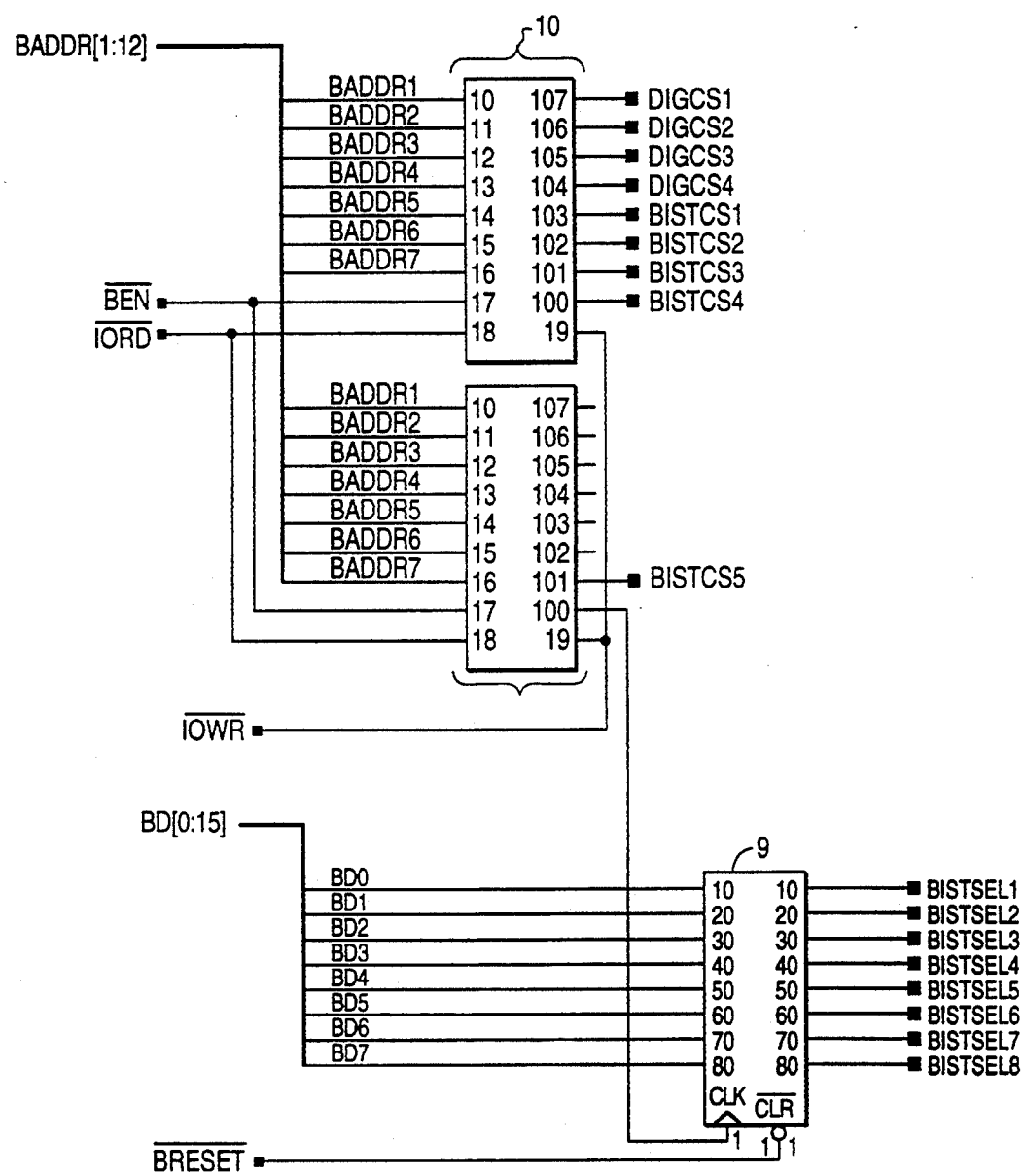

FIG. 2e shows how some of the various control signals are generated. Chip select programmed array logic devices (PAL's) 10 receive control signals and addresses from the system, i.e., board enable (BEN), input-/output read and write (IORD, IOWR) and board reset (BRESET), and buffered addresses and data (BADDR, BD) signals. In response, they produce the eight chip select signals DIGCS1-DIGCS4 and BISTCS1-BISTCS4 to select latches and buffers on the I/O board. For example, DIGCS1 selects the buffer 7, BISTCS1 selects the BIST latch 8, and BISTCS5 selects the latch $5h$.

FIG. 2e shows that the BISTSET latch 9, the input system data bus BD[0:7] and is clocked by an output of the PAL's 10, to provide the BISTSEL1-BISTSEL8 signals. For example, the BISTSEL1 signal to multiplexer 6 of FIG. 2b selects either input from the isolated inputs 4 or the BIST latch 8.

Thus, test signals may be selectively provided to the input circuits on-line according to the described embodiment. Advantageous features of the present invention include auctioneered power sources between BIST circuitry and input signals, an analog multiplexed switching matrix for test injection, and isolated BIST test signals to each optocoupler input circuit.

It is understood that various other modifications will be apparent to and can be readily made by those skilled in the art without departing from the scope and spirit of the present invention. Accordingly, it is not intended that the scope of the claims appended hereto be limited to the description set forth above but rather that the claims be construed as encompassing all of the features of patentable novelty which reside in the present invention, including all features which would be treated as equivalents thereof by those skilled in the art to which the invention pertains.

For example, the control logic described may take other forms. Instead of programmed logic array devices, discrete logic devices could be used to provide the control signals.

What is claimed is:

1. An optocoupler circuit arrangement comprising:
   an isolated power source for producing a bipolar test signal;
   an analog multiplexer switching matrix, operatively coupled to the isolated power source, for receiving and distributing the test signal;
   control means for controlling the analog multiplexer switching matrix; and
   a plurality of optocouplers, each having a respective electrically isolated output circuit, and an input circuit for receiving input signals from an external source, wherein the optocoupler input circuits are operatively coupled to the analog multiplexer switching matrix for receiving respective test signals therefrom under control of the control means, and wherein the input circuits include blocking means for blocking the test signals from the external source., 2. An optocoupler circuit arrangement according to claim 1, wherein the isolated power source comprises a DC-DC converter for producing the bipolar test signal.

3. An optocoupler circuit arrangement according to claim 1, wherein the analog multiplexer switching matrix comprises a plurality of pairs of analog multiplexers, a first multiplexer in a pair receiving and distributing a positive half of the bipolar test signal and a second multiplexer in a pair receiving and distributing a negative half of the bipolar test signal.

4. An optocoupler circuit arrangement according to claim 3, wherein the plurality of pairs of analog multiplexers receive a plurality of control signals from the control means for controlling the overall operation of the analog multiplexers including selecting which of the plurality of optocoupler input circuits receives the test signal.

5. An optocoupler circuit arrangement according to claim 4, wherein the analog multiplexer switching matrix is electrically isolated by isolating means from the control means.

6. An optocoupler circuit arrangement according to claim 1, wherein the blocking means comprises a respective protection diode in series with a respective optocoupler input for preventing test signal current flow back into the external source of input signals.

7. An optocoupler circuit arrangement according to claim 6, wherein the blocking means further comprises respective resistors in series with the respective diodes, for limiting current flowing through the optocoupler input circuit.

8. An optocoupler circuit arrangement according to claim 7, wherein each resistor has a value selected according to a predetermined input signal level from the external source.

9. An optocoupler circuit arrangement according to claim 1, wherein the electrically isolated output circuits of each of the optocouplers include pull-up current limiting resistors coupled to a +5V source, whereby a logic-level "0" is output if an input voltage level at an optocoupler input circuit is higher than a minimum turn-on voltage, and a logic level "1" is output if the input voltage is zero.

10. An optocoupler circuit self-test arrangement, for testing at least one optocoupler without compromising electrical isolation provided between a source of input signals connected to an input of the optocoupler and a load for output signals connected to an output of the optocoupler, comprising:

test signal means for selectively producing at least one test signal, said test signal means being operatively coupled to provide the at least one test signal to the at least one optocoupler input; and protection means, operatively coupled between the at least one optocoupler and the source of input signals, for preventing a test signal from reaching the source of input signals.

11. The optocoupler circuit self-test arrangement according to claim 10, wherein the at least one optocoupler comprises a plurality of optocouplers, and wherein the test signal means comprises:

an isolated power source for producing a bipolar signal;

an analog switching matrix, for receiving the bipolar signal from the power source and selectively outputting test signals to the optocoupler inputs; and control means, for controlling the analog switching matrix.

12. The optocoupler circuit self-test arrangement according to claim 11, wherein the isolated power source comprises:

a DC-DC converter producing a positive voltage at a positive terminal and a negative voltage at a negative terminal, with respect to a common terminal thereof;

filtering and regulating means, connected to the positive, negative and common terminals of the DC-DC converter, including series resistors at the positive and negative terminals respectively, Zener diodes connected to the common terminal and the respective series resistors, and filter capacitors each connected in parallel with respective Zener diode; and first and second isolation diodes, each connected in series with a respective series resistor, for preventing reverse voltages to the isolated power source and for providing the bipolar test signal output from the isolated power source.

13. The optocoupler circuit self-test arrangement according to claim 11, wherein the analog switching matrix comprises multiplexer pairs for receiving the bipolar signal from the isolated power source and distributing it as the test signals to respective optocouplers under control of the control means.

14. The optocoupler circuit self-test arrangement according to claim 11, wherein the control means comprises:

latch means for receiving and latching data from and external data bus, the data representing switching matrix control signals; and a plurality of optocouplers having inputs connected to respective outputs of the latch means, for providing isolated control signals at outputs thereof to the analog switching matrix.

15. The optocoupler circuit self-test arrangement according to claim 10, wherein the protection means comprises a series connection of a resistor and a diode, and wherein a test signal input to the at least one optocoupler is prevented from reaching the source of input signals.

* * * * *